United States Patent
JangJian et al.

(10) Patent No.: US 8,759,952 B2
(45) Date of Patent: Jun. 24, 2014

(54) OXYGEN-RICH LAYERS UNDERLYING BPSG

(75) Inventors: Shiu-Ko JangJian, Tainan (TW); Wan-Ting Huang, Shanhua Township (TW); Yu-Jen Chien, Taipei (TW); Phil Sun, Kaohsiung (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 5 days.

(21) Appl. No.: 13/358,365

(22) Filed: Jan. 25, 2012

(65) Prior Publication Data

US 2012/0119303 A1 May 17, 2012

Related U.S. Application Data

(60) Continuation of application No. 12/779,810, filed on May 13, 2010, now Pat. No. 8,114,741, which is a division of application No. 11/803,437, filed on May 15, 2007, now Pat. No. 7,741,171.

(51) Int. Cl.
*H01L 23/58* (2006.01)

(52) U.S. Cl.
USPC ........... 257/632; 257/635; 257/637; 257/646; 438/199

(58) Field of Classification Search
USPC .................... 438/199; 257/632, 635, 646
See application file for complete search history.

(56) References Cited

U.S. PATENT DOCUMENTS

| | | | |
|---|---|---|---|
| 5,271,972 A | 12/1993 | Kwok et al. | |
| 5,393,708 A | 2/1995 | Hsia et al. | |
| 5,741,725 A | 4/1998 | Inoue et al. | |
| 5,750,211 A * | 5/1998 | Weise et al. | 427/579 |
| 5,811,872 A * | 9/1998 | Machida et al. | 257/635 |
| 6,042,887 A * | 3/2000 | Chien et al. | 438/435 |
| 6,057,242 A * | 5/2000 | Kishimoto | 438/692 |
| 6,090,675 A * | 7/2000 | Lee et al. | 438/301 |
| 6,090,725 A | 7/2000 | Yang et al. | |
| 6,225,236 B1 * | 5/2001 | Nishimoto et al. | 438/778 |
| 6,255,179 B1 * | 7/2001 | Cantell et al. | 438/301 |
| 6,329,717 B1 * | 12/2001 | Jang et al. | 257/750 |
| 6,374,770 B1 | 4/2002 | Lee et al. | |
| 6,521,529 B1 | 2/2003 | Ngo et al. | |
| 6,613,696 B2 * | 9/2003 | Wen et al. | 438/769 |
| 6,649,541 B1 * | 11/2003 | Evans et al. | 438/791 |
| 6,943,091 B2 * | 9/2005 | Yu et al. | 438/424 |
| 7,037,774 B1 * | 5/2006 | Syau | 438/230 |
| 7,074,701 B2 * | 7/2006 | Cheng et al. | 438/597 |
| 7,169,677 B2 * | 1/2007 | Tews | 438/303 |
| 7,638,427 B2 * | 12/2009 | Froment et al. | 438/649 |
| 7,741,171 B2 | 6/2010 | JangJian et al. | |
| 2001/0048146 A1 * | 12/2001 | Wen et al. | 257/639 |
| 2002/0025647 A1 * | 2/2002 | Lee | 438/396 |
| 2002/0052128 A1 * | 5/2002 | Yu et al. | 438/792 |

(Continued)

*Primary Examiner* — Thao X Le
*Assistant Examiner* — Eric Jones
(74) *Attorney, Agent, or Firm* — Slater and Matsil, L.L.P.

(57) ABSTRACT

An integrated circuit structure and a method of forming the same are provided. The method includes providing a surface; performing an ionized oxygen treatment to the surface; forming an initial layer comprising silicon oxide using first process gases comprising a first oxygen-containing gas and tetraethoxysilane (TEOS); and forming a silicate glass over the initial layer. The method may further include forming a buffer layer using second process gases comprising a second oxygen-containing gas and TEOS, wherein the first and the second process gases have different oxygen-to-TEOS ratio.

15 Claims, 7 Drawing Sheets

(56) References Cited

U.S. PATENT DOCUMENTS

| | | | |
|---|---|---|---|
| 2002/0073922 A1* | 6/2002 | Frankel et al. | 118/715 |
| 2005/0112859 A1* | 5/2005 | Cheng et al. | 438/597 |
| 2006/0084234 A1* | 4/2006 | Tews | 438/299 |
| 2006/0098132 A1* | 5/2006 | Shiota et al. | 349/43 |
| 2006/0172492 A1* | 8/2006 | Froment et al. | 438/257 |
| 2006/0246661 A1* | 11/2006 | Joo et al. | 438/257 |
| 2006/0292774 A1* | 12/2006 | Chen et al. | 438/197 |
| 2007/0066083 A1* | 3/2007 | Yang et al. | 438/764 |
| 2007/0105297 A1* | 5/2007 | Jeong et al. | 438/197 |
| 2007/0279562 A1* | 12/2007 | Rho et al. | 349/130 |
| 2008/0166888 A1* | 7/2008 | Hsu et al. | 438/787 |
| 2010/0221887 A1* | 9/2010 | JangJian et al. | 438/299 |

* cited by examiner

OXYGEN-RICH LAYERS UNDERLYING BPSG

This application is a continuation of U.S. patent application Ser. No. 12/779,810, entitled "Oxygen-Rich Layers Underlying BPSG," filed on May 13, 2010, which application is a divisional of U.S. patent application Ser. No. 11/803,437, entitled "Oxygen-Rich Layers Underlying BPSG," filed on May 15, 2007, which applications are hereby incorporated herein by reference.

TECHNICAL FIELD

This invention relates generally to integrated circuits, and more particularly to the formation of dielectric layers underlying boron and/or phosphorous containing silicate glass.

BACKGROUND

In modern integrated circuits, semiconductor devices are formed on semiconductor substrates, and are connected through metallization layers. The metallization layers are interconnected to the semiconductor devices through contact plugs. Also, external pads are connected to the semiconductor devices through the contact plugs.

The metallization layers are separated from each other by dielectric layers. Further, the metallization layers are separated from active devices by an inter-layer dielectric (ILD). Conventionally, the dielectric layers, particularly the ILDs, are often formed of boronphosphosilicate glass (BPSG).

Figure 1:
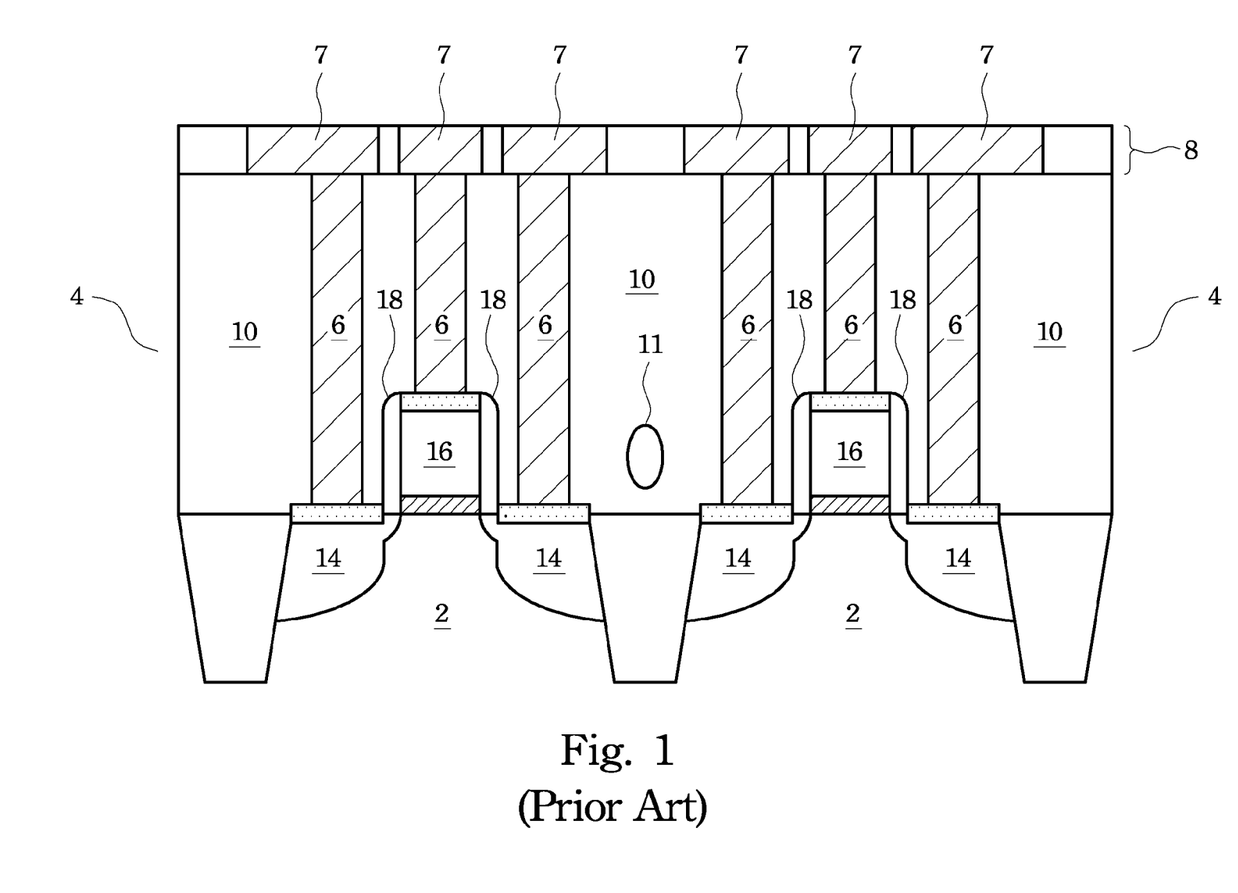
FIG. 1 illustrates a conventional semiconductor structure having an inter-layer dielectric comprising boronphosphosilicate glass, wherein a void is formed.

FIG. 1 illustrates a conventional structure. Transistors 4, which include gates 16 and source/drain regions 14, are formed at the surface of semiconductor substrate 2. Inter-layer dielectric (ILD) 10 is formed on transistors 4. Contact plugs 6 are formed in ILD 10 to electrically connect source and drain regions 14 and gates 16 to metal lines 7 in metallization layer 8. Typically, the formation of contact plugs 6 includes forming openings in ILD 10, and then filling the openings with tungsten plugs. A single damascene process is then performed to form metallization layer 8.

With the down-scaling of integrated circuits, the formation of ILD 10 experiences shortcomings. Due to the increase in the aspect ratio of the gaps between transistors 4, the gap filling of ILD 10 becomes increasingly difficult. Particularly, at the top corners 18 of the gate structures, BPSG tends to be deposited faster than in the middle region between gates 16, hence void 11 may be generated. This situation becomes worse in integrated circuits formed using 90 nm technology or below. Also, boron and phosphorous tend to accumulate in the bottom portions of the BPSG ILD 10. In the etching of ILD 10 for forming contact openings, lateral etching may result in the bottom portions of the BPSG ILD 10. In addition, boron and phosphorous may penetrate into devices, resulting the electrical property shift and even the failure of the devices.

Accordingly, what is needed in the art is a new dielectric structure and formation methods for solving the above-discussed problems.

SUMMARY OF THE INVENTION

In accordance with one aspect of the present invention, a method for forming an integrated circuit structure includes providing a surface; performing an ionized oxygen treatment to the surface; forming an initial layer comprising silicon oxide using first process gases comprising a first oxygen-containing gas and tetraethoxysilane (TEOS); and forming a silicate glass over the initial layer.

In accordance with another aspect of the present invention, a method of forming an integrated circuit structure includes providing a semiconductor substrate; forming an initial layer over the semiconductor substrate using process gases comprising first oxygen-containing gas and a first TEOS, wherein a flow rate of the first oxygen-containing gas and a flow rate of the TEOS have a first ratio; forming a buffer layer over the initial layer using process gases comprising a second oxygen-containing gas and TEOS, wherein a flow rate of the second oxygen-containing gas and a flow rate of the TEOS have a second ratio, and wherein the first ratio is substantially greater than the second ratio; and forming a boronphosphosilicate glass (BPSG) layer over the buffer layer.

In accordance with yet another aspect of the present invention, a method of forming an integrated circuit structure includes providing a semiconductor substrate and forming a transistor at a top surface of the semiconductor substrate. The step of forming the transistor includes forming a gate stack on the semiconductor substrate; forming a gate spacer on a sidewall of the gate stack; forming a source/drain region adjacent the gate stack; and forming a source/drain silicide region on the source/drain region. The method further includes providing ionized ozone to activate exposed surfaces of materials over the semiconductor substrate; blanket forming an initial layer on the exposed surfaces using process gases comprising a first oxygen-containing gas and TEOS, wherein a flow rate of the first oxygen-containing gas and a flow rate of the TEOS have a first ratio of greater than about 8; forming a buffer layer on the initial layer using process gases comprising a second oxygen-containing gas and TEOS, wherein a flow rate of the second oxygen-containing gas and a flow rate of the TEOS have a second ratio of less than about 3; and forming an inter-layer dielectric (ILD) layer comprising BPSG, wherein the buffer layer is between and adjoining the initial layer and the ILD layer.

In accordance with yet another aspect of the present invention, an integrated circuit structure includes a semiconductor substrate; an initial layer comprising a first silicon oxide over the semiconductor substrate, wherein the first silicon oxide has a first oxygen-to-silicon atomic ratio; a silicate glass over the initial layer; and a buffer layer comprising a second silicon oxide between and adjoining the initial layer and the silicate glass, wherein the second silicon oxide has a second oxygen-to-silicon atomic ratio substantially less than the first oxygen-to-silicon atomic ratio.

In accordance with yet another aspect of the present invention, an integrated circuit structure includes a semiconductor substrate and a transistor. The transistor includes a gate stack on the semiconductor substrate; a gate spacer on a sidewall of the gate stack; a source/drain region adjacent the gate stack; and a source/drain silicide region on the source/drain region. The integrated circuit structure further includes an initial layer comprising a first TEOS oxide over the semiconductor substrate and the transistor; a buffer layer comprising a second TEOS oxide on the initial layer, wherein the first TEOS oxide comprises more oxygen than the second TEOS oxide; and a BPSG on the buffer layer, wherein the buffer layer is between and adjoins the initial layer and the BPSG.

The advantageous features of the present invention include improved gap filling ability of dielectric layers and reduced lateral etching in the dielectric layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming dielectric layers is provided. The intermediate stages of manufacturing a preferred embodiment of the present invention are illustrated. The variations of the preferred embodiment are then discussed. Throughout the various views and illustrative embodiments of the present invention, like reference numbers are used to designate like elements.

Figure 2:
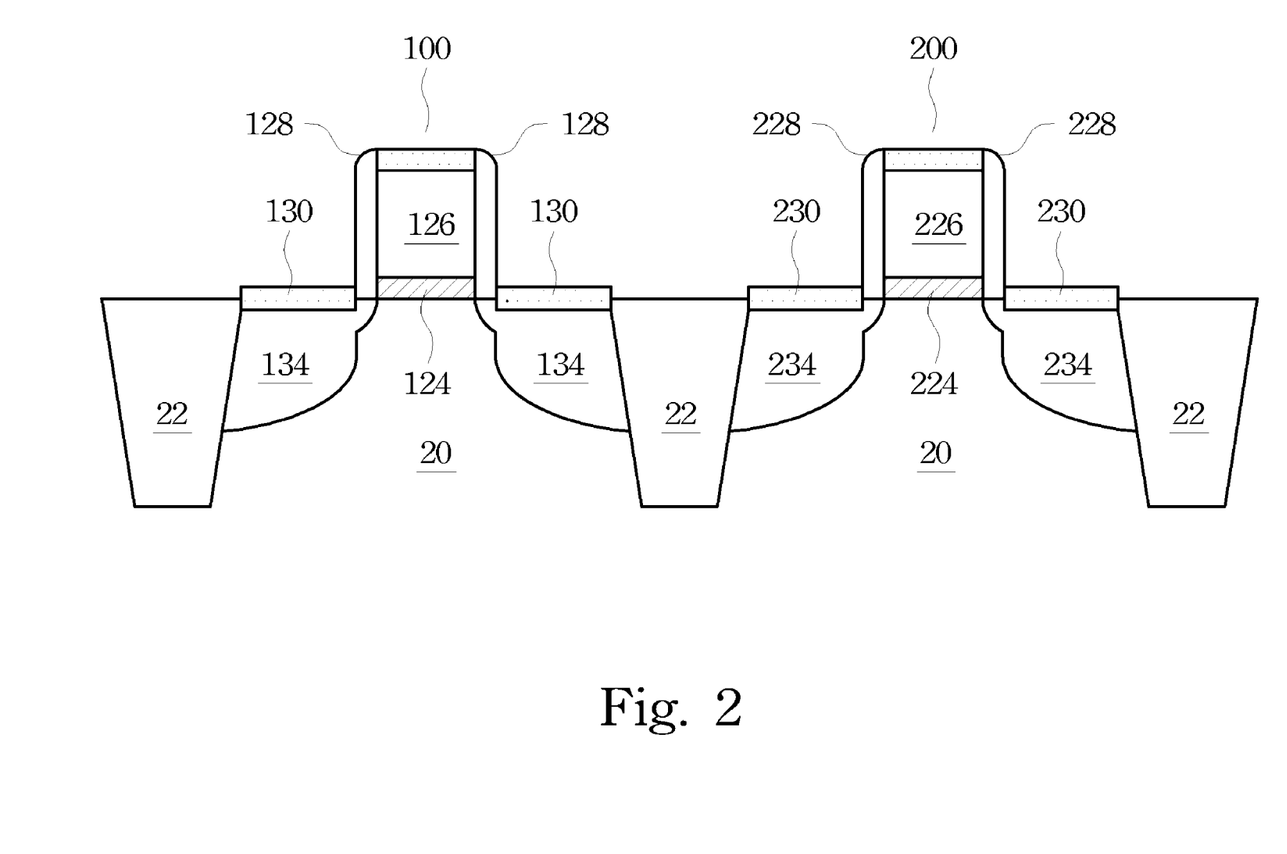
FIGS. 2 through 7 are cross-sectional views of intermediate stages in the manufacturing of an embodiment of the present invention.

FIGS. 2 though 7 illustrate cross-sectional views of an embodiment of the present invention. Referring to FIG. 2, substrate 20 is provided. Substrate 20 is preferably a semiconductor substrate, which may include single-crystalline semiconductor materials such as silicon, or compound materials comprising commonly used group III, group IV and group V elements.

Transistors 100 and 200 are formed at the surface of substrate 20. Transistor 100 includes gate dielectric 124, gate electrode 126, gate spacers 128, source/drain regions 134 and silicide regions 130. Similarly, transistor 200 includes gate dielectric 224, gate electrode 226, gate spacers 228, source/drain regions 234 and silicide regions 230. Shallow trench isolation (STI) regions 22 may be formed to isolate semiconductor devices.

In an embodiment, STI regions 22 are formed of dielectric materials, such as high-density plasma (HDP) oxides, plasma enhanced oxides, thermal reacted oxides, and the like. Gate spacers 128 and 228 are also formed of dielectric materials, such as oxides, nitrides, oxynitrides, and the like. In the preferred embodiment, gate spacers 128 and 228 each include a silicon nitride layer on a liner oxide. Silicide regions 130 and 230 may comprise metal silicides or metal germanosilicides, wherein the metals in silicide regions 130 and 230 may include cobalt, nickel, platinum, palladium, tantalum, ruthenium, tungsten, and combinations thereof.

Figure 3:
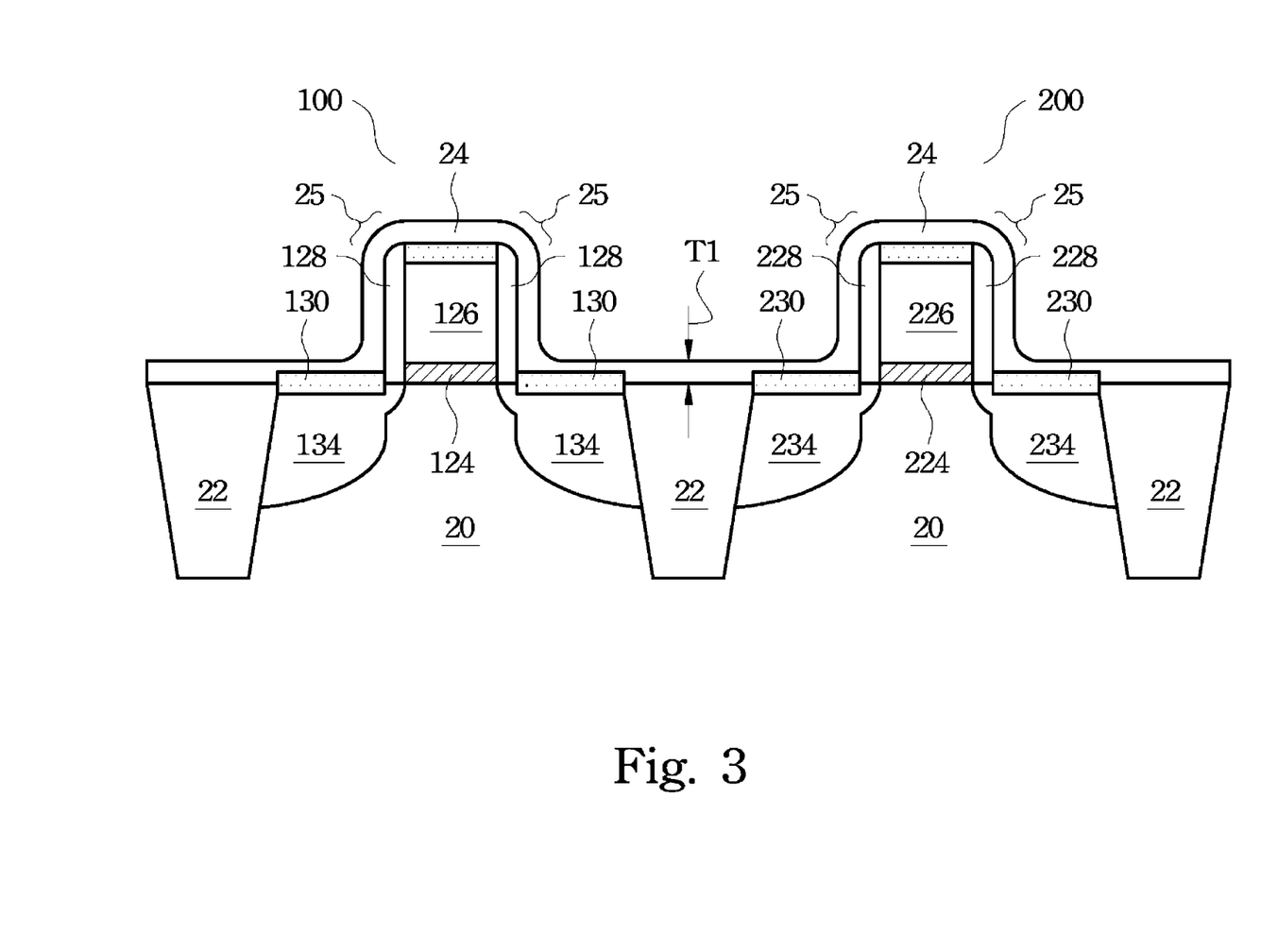

Referring to FIG. 3, etch stop layer (ESL) 24 is formed over substrate 20 transistors 100 and 200. In an embodiment, ESL 24 includes silicon nitride. In other embodiments, ESL 24 includes other commonly used dielectric materials, such as silicon oxynitride, silicon oxycarbide, silicon carbide, and the like. A thickness T1 of ESL 24 is preferably less than about 600 Å, and more preferably between about 200 Å and about 600 Å.

In alternative embodiments, ESL 24 is omitted, and the subsequently formed initial layer, buffer layer and inter-layer dielectric (ILD) are formed directly on transistors 100 and 200, and other active or passive devices (not shown), which may include resistors, capacitors, and the like. For simplicity, in subsequently discussed drawings, ESL 24 is not shown.

Figure 4:
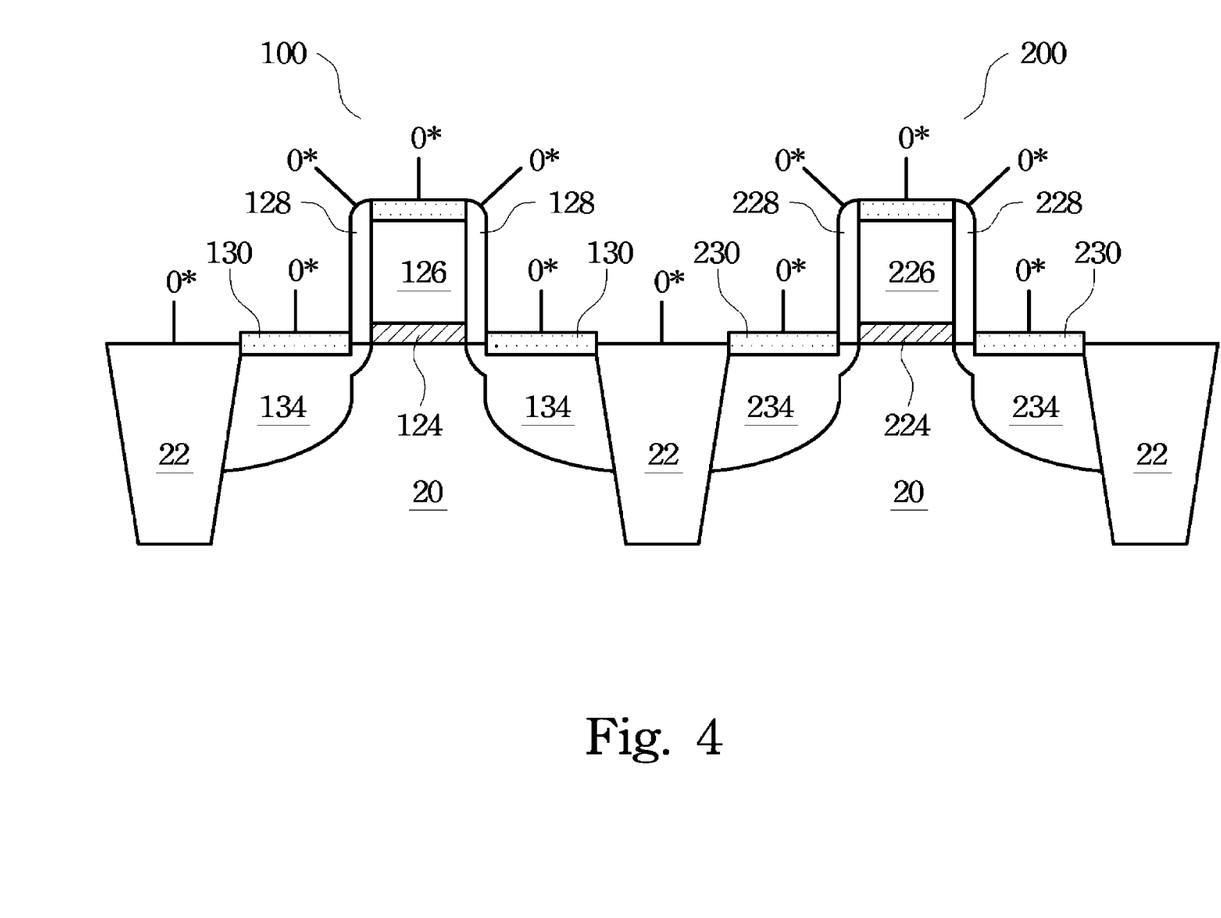

Referring to FIG. 4, the exposed surfaces of the structures formed in the preceding steps are treated in an oxygen-containing gas. In the preferred embodiment, the oxygen-containing gas contains $O_3$ (ozone). Alternatively, the oxygen-containing gas contains $O_2$ or a combined gas of ozone and $O_2$. A radio frequency (RF) power is applied, which breaks the bonds of the oxygen-containing gas and results in ionized oxygen, or an oxygen-containing plasma. The RF power needs to be low to avoid the bombardment to the exposed surfaces. Alternatively, a remote plasma of the oxygen-containing gas is used to activate the exposed surfaces, wherein the remote plasma is generated in a separate chamber and introduced into the chamber where the substrate 20 is located. In an exemplary embodiment, the RF power is less than about 100 watts, and the oxygen-containing gas has a flow rate of between about 5000 sccm and about 10000 sccm.

The treatment activates the exposed surfaces, resulting in the exposed surfaces to have greater electro negativity, and hence the bondability of the exposed surfaces is improved. Accordingly, the treatment is referred to as a surface activation process. The treatment also causes an increase in the number of precursor nucleation sites. In FIG. 4, O* is used to symbolize the nucleation sites with increased electro negativity. With the combination of improved bondability and increased number of precursor nucleation sites, the exposed surfaces have a greater and a more uniform ability to bond with the subsequently formed oxide layer. Such an improvement is particularly advantageous for the surfaces comprising different materials, such as oxides, nitrides, metal silicides, and the like, as is illustrated in FIG. 4. The bondability difference between different materials is accordingly reduced.

Figure 5:
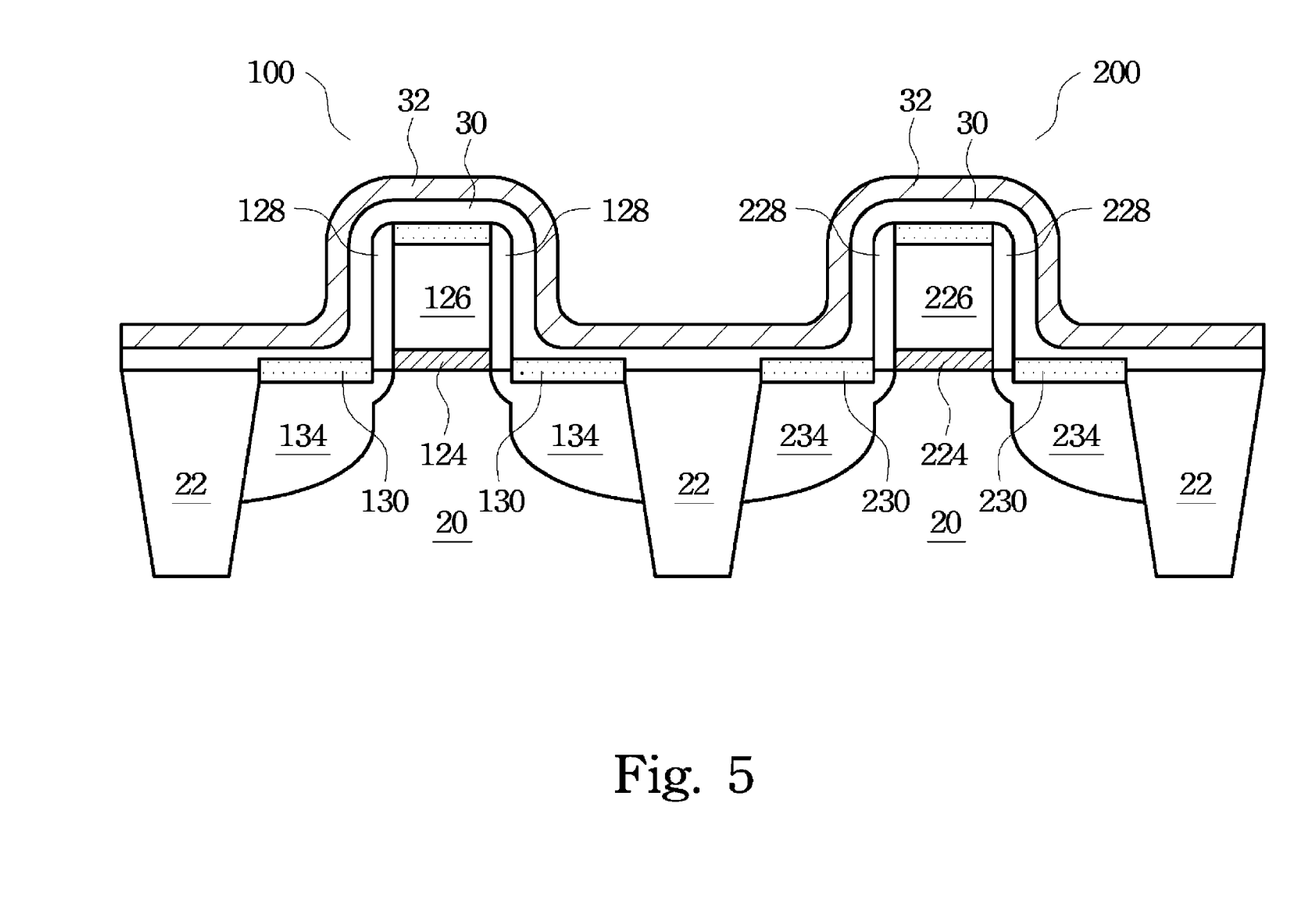

Referring to FIG. 5, initial layer 30, which is preferably performed using a chemical vapor deposition (CVD) method, is formed. In the preferred embodiment, the process gases for forming initial layer 30 include an oxygen-containing gas, which includes $O_2$, $O_3$, or the combinations thereof, and tetraethoxysilane (TEOS). The reaction of the oxygen-containing gas and TEOS results in the formation of TEOS oxide (silicon oxide). Preferably, the flow rate of the oxygen-containing gas and the flow rate of TEOS have a ratio (referred to as oxygen-to-TEOS ratio hereinafter) of greater than about eight. In an exemplary embodiment, the oxygen-containing gas has a flow rate of between about 1000 sccm and about 5000 sccm, while TEOS has a flow rate of between about 100 mgm and about 300 mgm. The resulting initial layer 30 may have a thickness of between about 5 nm and about 20 nm. The formation of initial layer 30 is preferably performed at elevated temperatures, for example, between about 300° C. and about 500° C. However, the reaction may also be plasma-assisted.

Advantageously, the TEOS oxide with a high oxygen-to-TEOS ratio has a high electro negativity, and is highly polarized, so that it can form strong bonds with the underlying surfaces. Combined with the greater and more uniform electro negativity of the underlying surfaces, the strong bonds of TEOS oxide result in improved gap filling ability and improved conformity of the subsequently gap filling materials. In the embodiment wherein ESL 24 (refer to FIG. 3) is formed, due to the fact that ESL 24 will have corners 25, which will adversely affect the gap filling of the subsequently formed ILD layer, the activation is still beneficial.

FIG. 5 also illustrates the formation of buffer layer 32, which may also be formed using chemical vapor deposition (CVD). In the preferred embodiment, buffer layer 32 is formed by introducing the same types of process gases as used in the formation of initial layer 30, for example, an oxygen-containing gas, which may be $O_2$, $O_3$, or the combinations thereof, and TEOS. In a more preferred embodiment, the formation of initial layer 30 and buffer layer 32 may be in-situ formed in the same reaction chamber, with no vacuum break therebetween. Preferably, the oxygen-to-TEOS ratio for forming buffer layer 32 is less than about three. In an exemplary embodiment, the oxygen-containing gas has a flow rate of between about 30 sccm and about 100 sccm, while TEOS has a flow rate of between about 100 mgm and about 500 mgm sccm. The resulting buffer layer 32 may have a thickness of between about 10 nm and about 50 nm. Similar to the formation of initial layer 30, the reaction may be performed thermally and/or with plasma.

The reduced oxygen-to-TEOS ratio results in the greater hardness of buffer layer 32. Advantageously, the greater percentage of TEOS in buffer layer 32 results in a relatively silicon-rich oxide, and hence more potential bonds (since each silicon atom has four vacancy sites). Since the subsequently formed boronphosphosilicate glass (BPSG) includes boron and phosphorous, which tend to have dangling bonds, the increased number of silicon atoms in buffer layer 32 may form more bonds with the boron and phosphorous atoms, and thus the adhesion between buffer layer 32 and the overlying BPSG increases. The adhesion between initial layer 30 and buffer layer 32 is satisfactory because of the similarity of these two layers. Therefore, buffer layer 32 acts as an excellent adhesion layer to bond together initial layer 30 and the subsequently formed BPSG layer.

A further advantageous feature of buffer layer 32 is that it acts as a penetration stop layer (PSL), preventing boron and phosphorous in the overlying BPSG from penetrating into the underlying devices, which may result in the electrical property shift of the underlying devices.

As a result of the above-discussed process steps, in initial layer 30, the TEOS oxide is relatively oxygen rich with a first oxygen-to-silicon atomic ratio, while in buffer layer 32, the TEOS oxide is relatively silicon rich with a second oxygen-to-silicon atomic ratio. Preferably, a ratio of the first oxygen-to-silicon atomic ratio to the second oxygen-to-silicon atomic ratio is greater than about 8.

Figure 6:
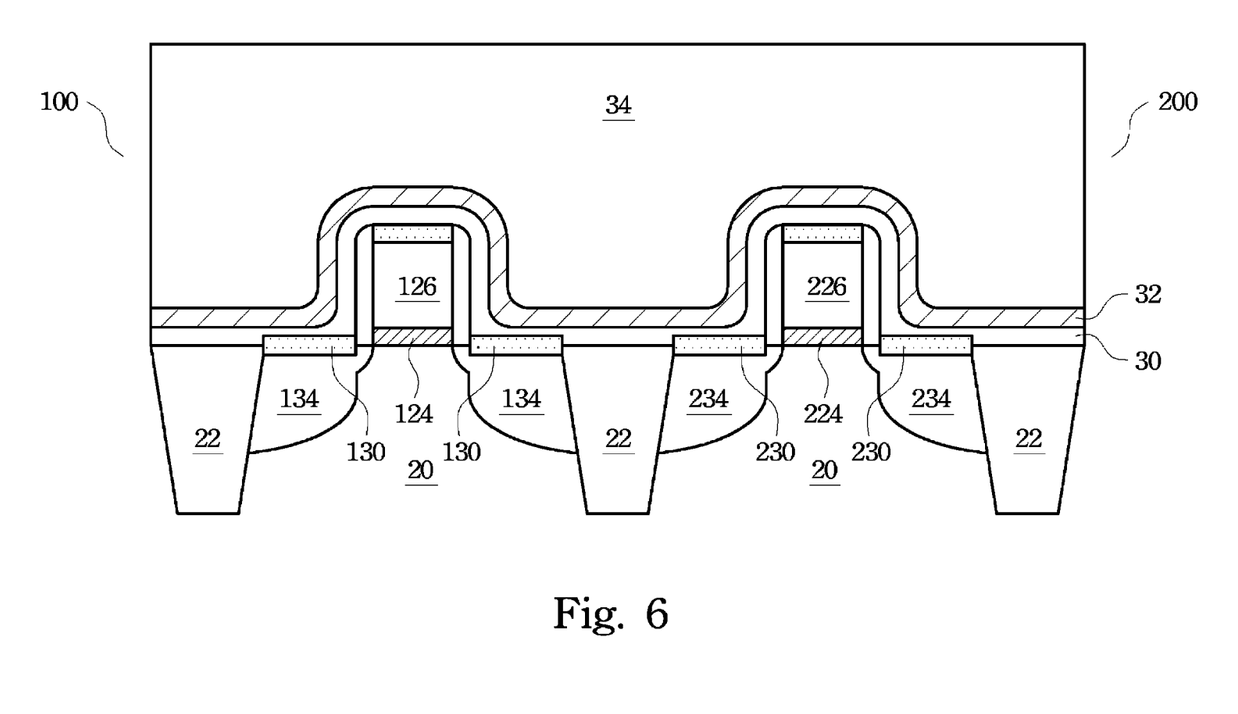

Next, ILD layer 34 is deposited on buffer layer 32, preferably by a CVD process, as is illustrated in FIG. 6. ILD layer 34 may be formed by introducing TEOS, a phosphorus-containing source, and a boron-containing source into a processing chamber along with an oxygen-containing gas. The resulting ILD layer 34 includes BPSG. An example of the phosphorus-containing source is tri-methyl-phosphate (TMPO). An example of the boron-containing source is tri-methyl-borate (TMB). In an exemplary embodiment, ILD layer 34 has a thickness of between about 200 nm and about 1200 nm. Alternatively, ILD layer 34 may include other types of silicate glasses, such as boron silicate glass or phosphosilicate glass. One skilled in the art will realize the respective precursors and the formation methods.

Figure 7:
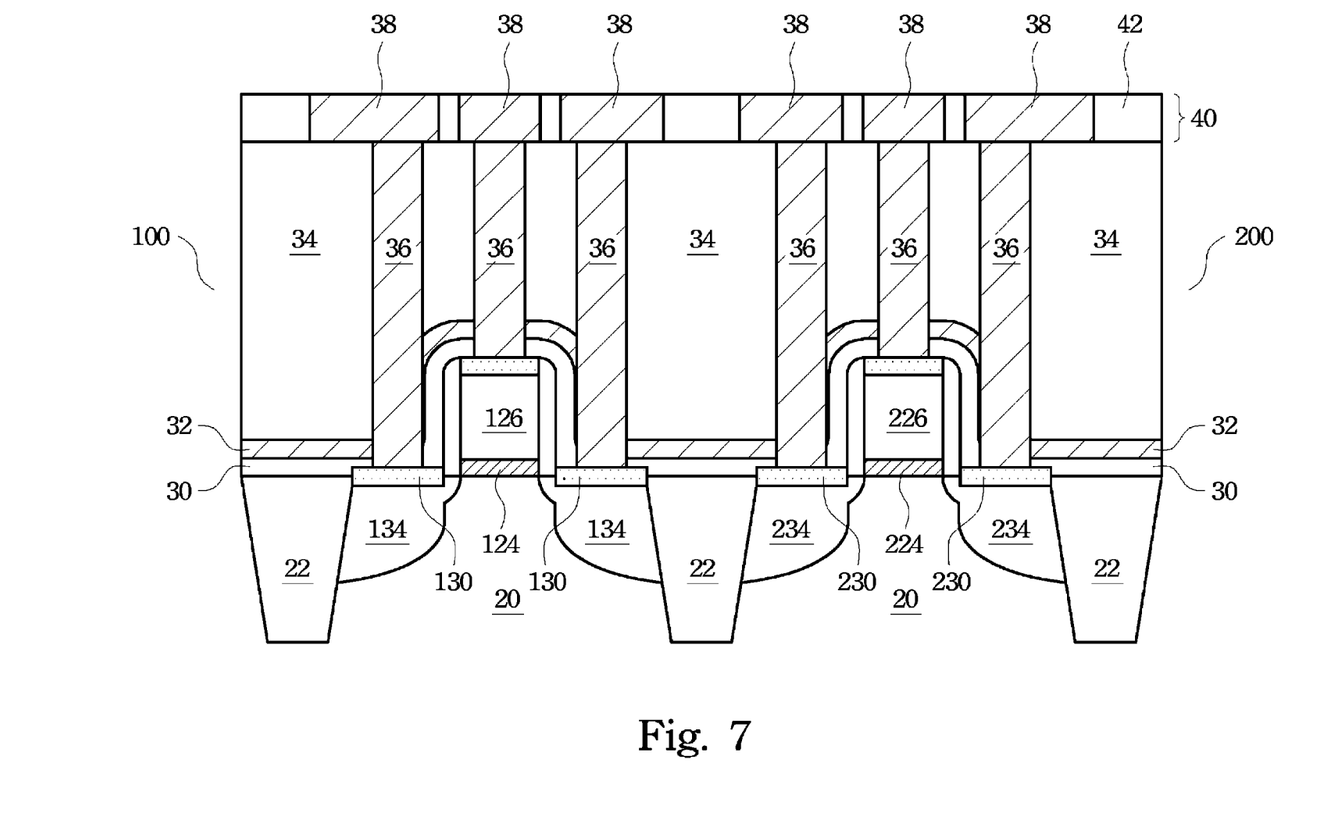

FIG. 7 illustrates the formation of contacts 36 used for connecting transistors 100 and 200 to the lowest metallization layer 40 (commonly referred to as M1). As is known in the art, to form contacts 36, contact openings are first formed by etching ILD 34. Metallic materials, such as tungsten, are then filled into the contact openings. Metallization layer 40, which includes metal lines 38 in dielectric layer 42, is then formed, preferably by a single damascene process.

Experiment results have shown that the embodiments of the present invention can effectively prevent lateral etching and the formation of voids. The samples having initial layers formed with oxygen-to-TEOS ratios less than about eight exhibit voids. However, similar samples formed using similar techniques, except that the oxygen-to-TEOS ratios are greater than eight, exhibited no noticeable voids. In other experiments, the samples having buffer layers formed with oxygen-to-TEOS ratios greater than three, the CESL exhibits lateral etching. However, similar samples, except the buffer layers were formed with oxygen-to-TEOS ratios less than three, showed no lateral etching.

In the embodiments discussed in the preceding paragraphs, although BPSG is used to form ILD, which underlies the lowest metallization layer, one skilled in the art will realize the teaching of the present invention is readily available for the formation of other dielectric layers, such as inter-metal dielectric layers, which are formed between metallization layers. Further, the formation of initial layer 30 and buffer layer 32 not only improves the ILD formation over transistors, the ILD formation on other devices and materials, such as resistors, capacitors, etch stop layers, and the like, also benefit from the improved conformity, adhesion, and penetration prevention ability.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
a semiconductor substrate;
an initial layer comprising a first silicon oxide over the semiconductor substrate, wherein the first silicon oxide is an oxygen-rich oxide having a first oxygen-to-silicon atomic ratio, with the first oxygen-to-silicon atomic ratio being the ratio of the number of oxygen atoms in the first silicon oxide to the number of silicon atoms in the first silicon oxide;
a buffer layer comprising a second silicon oxide over and contacting the initial layer, wherein the second silicon oxide has a second oxygen-to-silicon atomic ratio, with the second oxygen-to-silicon atomic ratio being the ratio of the number of oxygen atoms in the second silicon oxide to the number of silicon atoms in the second silicon oxide, and wherein a ratio of the first oxygen-to-silicon atomic ratio to the second oxygen-to-silicon atomic ratio is greater than about 8; and
a silicate glass layer over the initial layer.

2. The device of claim 1 further comprising a dielectric layer underlying and adjoining the initial layer, wherein the dielectric layer and the initial layer comprise different materials.

3. The device of claim 1, wherein the silicate glass layer comprises boronphosphosilicate glass (BPSG).

4. The device of claim 1, wherein the buffer layer is in contact with the silicate glass layer.

5. The device of claim 1, wherein the buffer layer and the initial layer are substantially free from boron and phosphorous.

6. The device of claim 1 further comprising:
a transistor comprising:

a gate stack over the semiconductor substrate;
a gate spacer on a sidewall of the gate stack;
a source/drain region adjacent to the gate stack; and
a source/drain silicide region on the source/drain region, wherein the gate spacer and the source/drain silicide region each comprise a portion underlying and in physical contact with the initial layer.

7. The device of claim 6, wherein the initial layer contacts a top surface of a trench isolation region in the semiconductor substrate.

8. A device comprising:
a semiconductor substrate;
a transistor comprising;
   a gate stack over the semiconductor substrate;
   a gate spacer on a sidewall of the gate stack;
   a source/drain region adjacent to the gate stack; and
   a source/drain suicide region on the source/drain region;
an initial layer comprising a first tetraethoxysilane (TEOS) oxide over the semiconductor substrate and the transistor, wherein the first TEOS oxide is an oxygen-rich oxide;
a buffer layer comprising a second TEOS oxide over the initial layer, wherein the first TEOS oxide has a first oxygen-to-silicon atomic ratio, with the first oxygen-to-silicon atomic ratio being the ratio of the number of oxygen atoms in the first TEOS oxide to the number of silicon atoms in the first TEOS oxide, the second TEOS oxide has a second oxygen-to-silicon atomic ratio, with the second oxygen-to-silicon atomic ratio being the ratio of the number of oxygen atoms in the second TEOS oxide to the number of silicon atoms in the second TEOS oxide, and wherein a ratio of the first oxygen-to-silicon atomic ratio to the second oxygen-to-silicon atomic ratio is greater than about 8; and
a boronphosphosilicate glass (BPSG) over the buffer layer, wherein the buffer layer adjoins the initial layer and the BPSG.

9. The device of claim 8, wherein the initial layer is in contact with the gate spacer and the source/drain silicide region.

10. The device of claim 8 further comprising an etch stop layer between the initial layer and the source/drain silicide region, wherein the etch stop layer and the initial layer comprise different materials.

11. The device of claim 10, wherein the etch stop layer comprises a material selected from the group consisting essentially of silicon nitride, silicon oxynitride, silicon oxycarbide, silicon carbide, and combinations thereof.

12. The device of claim 8, wherein the initial layer contacts a top surface of a trench isolation region in the semiconductor substrate.

13. A device comprising:
a semiconductor substrate;
a dielectric layer over the semiconductor substrate;
an initial layer comprising a first silicon oxide over and adjoining the dielectric layer, wherein the first silicon oxide is an oxygen-rich oxide having a first oxygen-to-silicon atomic ratio, with the first oxygen-to-silicon atomic ratio being the ratio of the number of oxygen atoms in the first silicon oxide to the number of silicon atoms in the first silicon oxide;
a buffer layer comprising a second silicon oxide over and contacting the initial layer, wherein the second silicon oxide has a second oxygen-to-silicon atomic ratio, with the second oxygen-to-silicon atomic ratio being the ratio of the number of oxygen atoms in the second silicon oxide to the number of silicon atoms in the second silicon oxide, wherein a ratio of the first oxygen-to-silicon atomic ratio to the second oxygen-to-silicon atomic ratio is greater than about 8; and
a silicate glass layer over the initial layer.

14. The device of claim 13, wherein the buffer layer is more silicon-rich than the initial layer.

15. The device of claim 13, wherein the silicate glass layer comprises boronphosphosilicate glass (BPSG).

* * * * *

UNITED STATES PATENT AND TRADEMARK OFFICE
CERTIFICATE OF CORRECTION

PATENT NO. : 8,759,952 B2  Page 1 of 1
APPLICATION NO. : 13/358365
DATED : June 24, 2014
INVENTOR(S) : JangJian et al.

It is certified that error appears in the above-identified patent and that said Letters Patent is hereby corrected as shown below:

In the Claims

Col. 7, line 18, claim 8, delete "suicide" and insert --silicide--.

Signed and Sealed this
Ninth Day of September, 2014

Michelle K. Lee
*Deputy Director of the United States Patent and Trademark Office*